(12) United States Patent
Van Mau et al.

(10) Patent No.: US 7,735,045 B1
(45) Date of Patent: Jun. 8, 2010

(54) METHOD AND APPARATUS FOR MAPPING FLIP-FLOP LOGIC ONTO SHIFT REGISTER LOGIC

(75) Inventors: David Nguyen Van Mau, Seyssinet (FR); Yassine Rjimati, Grenoble (FR)

(73) Assignee: Xilinx, Inc., San Jose, CA (US)

( * ) Notice: Subject to any disclaimer, the term of this patent is extended or adjusted under 35 U.S.C. 154(b) by 287 days.

(21) Appl. No.: 12/047,184

(22) Filed: Mar. 12, 2008

(51) Int. Cl.
*G06F 17/50* (2006.01)
(52) U.S. Cl. .............................. 716/16; 716/17; 714/725
(58) Field of Classification Search ............. 716/16–17; 714/725
See application file for complete search history.

(56) References Cited

U.S. PATENT DOCUMENTS

| | | | | |
|---|---|---|---|---|
| 3,970,993 A | * | 7/1976 | Finnila | 712/14 |
| 4,680,759 A | * | 7/1987 | Miller et al. | 370/535 |
| 4,706,216 A | * | 11/1987 | Carter | 365/94 |
| 5,280,488 A | * | 1/1994 | Glover et al. | 714/784 |
| 5,497,378 A | * | 3/1996 | Amini et al. | 714/727 |
| 5,689,517 A | * | 11/1997 | Ruparel | 714/731 |
| 6,067,648 A | * | 5/2000 | Hunter et al. | 714/718 |
| 6,578,166 B1 | * | 6/2003 | Williams | 714/726 |
| 7,337,422 B1 | * | 2/2008 | Becker et al. | 716/16 |

\* cited by examiner

*Primary Examiner*—Naum B Levin
(74) *Attorney, Agent, or Firm*—Robert M. Brush; Lois D. Cartier

(57) ABSTRACT

Method and apparatus for mapping flip-flop logic onto shift register logic is described. In one example, a method of processing flip-flop logic in a circuit design for implementation in an integrated circuit is provided. A chain of flip-flops in the circuit design is identified. The chain of flip-flops includes first and second control signals. A shift register is instantiated in a logical description of the circuit design for the chain of flip-flops. A shift register is instantiated in the logical description for the chain of flip-flops. First and second control chains of flip-flops are instantiated in the logical description for the first and second control signals, respectively. A multiplexer is instantiated in the logical description and is configured to select among an output of the shift register, an asserted logic state, and a de-asserted logic state based on outputs of the first and second control chains.

7 Claims, 9 Drawing Sheets

US 7,735,045 B1

METHOD AND APPARATUS FOR MAPPING FLIP-FLOP LOGIC ONTO SHIFT REGISTER LOGIC

FIELD OF THE INVENTION

One or more aspects of the present invention relate generally to integrated circuit design and, more particularly, to a method and apparatus for mapping flip-flop logic onto shift register logic.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs), programmable input/output blocks (IOBs), and like type programmable elements. The CLBs and IOBs are interconnected by a programmable interconnect structure. An FPGA may also include various dedicated logic circuits, such as memories, digital clock managers (DCMs), and input/output (I/O) transceivers. Notably, an FPGA may include one or more embedded processors. The programmable logic of an FPGA (e.g., CLBs, IOBs, and interconnect structure) is typically programmed by loading a stream of configuration data (known as a bitstream) into internal configuration memory cells. The bitstream is typically stored in an external nonvolatile memory, such as an erasable programmable read only memory (EPROM). The states of the configuration memory cells define how the CLBs, IOBs, interconnect structure, and other programmable logic are configured.

Some circuit designs targeted for implementation in an FPGA may include one or more chains of flip-flops. A chain of flip-flops may be used in a circuit design to implement the functionality of a shift register. When the circuit design is translated for implementation in an FPGA, a flip-flop may occupy a particular area within the FPGA. For example, a flip-flop in a circuit design may occupy a particular percentage of a CLB in an FPGA. As the number of flip-flops in a chain increases, and as the number of flip-flop chains in a circuit design increases, the area in the FPGA occupied by these chains increases.

Some FPGAs may be capable of implementing dedicated shift register logic. For example, some FPGAs may include the capability of implementing one or more shift registers in a CLB (e.g., using look up tables (LUTs)). The shift register capability may be referred to as a shift register primitive of the FPGA. A shift register primitive may occupy less implementation area in an FPGA than a corresponding chain of flip-flops. For example, if a flip-flop occupies x % of a CLB, then a chain of four flip-flops occupies 4x% of a CLB. In contrast, a shift register primitive configured to store at least four values (i.e., functionally equivalent to the chain of four flip-flops) may occupy only x % of a CLB. As such, it is desirable to use shift register primitives in place of flip-flop chains when implementing a design for an FPGA in order to reduce the area used by the design. Resources in an FPGA, such as CLB resources, may be scarce, making it advantageous to reduce design implementation area as much as possible.

Accordingly, there exists a need in the art for a method and apparatus that maps flip-flop logic onto shift register logic when translating a circuit design for implementation in a PLD, such as an FPGA.

SUMMARY OF THE INVENTION

An aspect of the invention relates to a method of processing flip-flop logic in a circuit design for implementation in an integrated circuit. A chain of flip-flops in the circuit design is identified. The chain of flip-flops includes first and second control signals. A shift register is instantiated in the logical description for the chain of flip-flops. First and second control chains of flip-flops are instantiated in the logical description for the first and second control signals, respectively. A multiplexer is instantiated in the logical description and is configured to select among an output of the shift register, an asserted logic state, and a de-asserted logic state based on outputs of the first and second control chains.

Another aspect of the invention relates to a method of implementing a circuit design for an integrated circuit. A behavioral description of the circuit design is translated into a logical description based on an architecture of the integrated circuit. During the translation, a chain of flip-flops in the circuit design is identified, where the chain of flip-flops including first and second control signals. A shift register is instantiated in the logical description for the chain of flip-flops. First and second control chains of flip-flops are instantiated in the logical description for the first and second control signals, respectively. A multiplexer is instantiated in the logical description and is configured to select among an output of the shift register, an asserted logic state, and a de-asserted logic state based on outputs of the first and second control chains. An implementation is generating of the circuit design for the integrated circuit from the logical description.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Method and apparatus for mapping flip-flop logic onto shift register logic is described. Some aspects of the invention relate to mapping a chain of flip-flops in a circuit design having a plurality of control signals onto a controlled shift register primitive that can be implemented in a target programmable logic device (PLD). Embodiments of the controlled shift register primitive are described below. The mapping functionality may be implemented in one or more tools that are part of the PLD design flow, such as a logic synthesis tool or logic mapping tool. As described in more detail below, as the number of flip-flops in a chain increases and/or the number of flip-flop chains increases, the use of controlled shift register primitives provides for an increases gain in implementation area (i.e., the shift register primitives use less implementation area in the PLD than the flip-flop chains). First, an exemplary architecture of a PLD is described along with exemplary configurations of logic therein. Next, an exemplary design tool chain is shown, followed by embodiments of the mapping process and the controlled shift register primitive.

Figure 1:
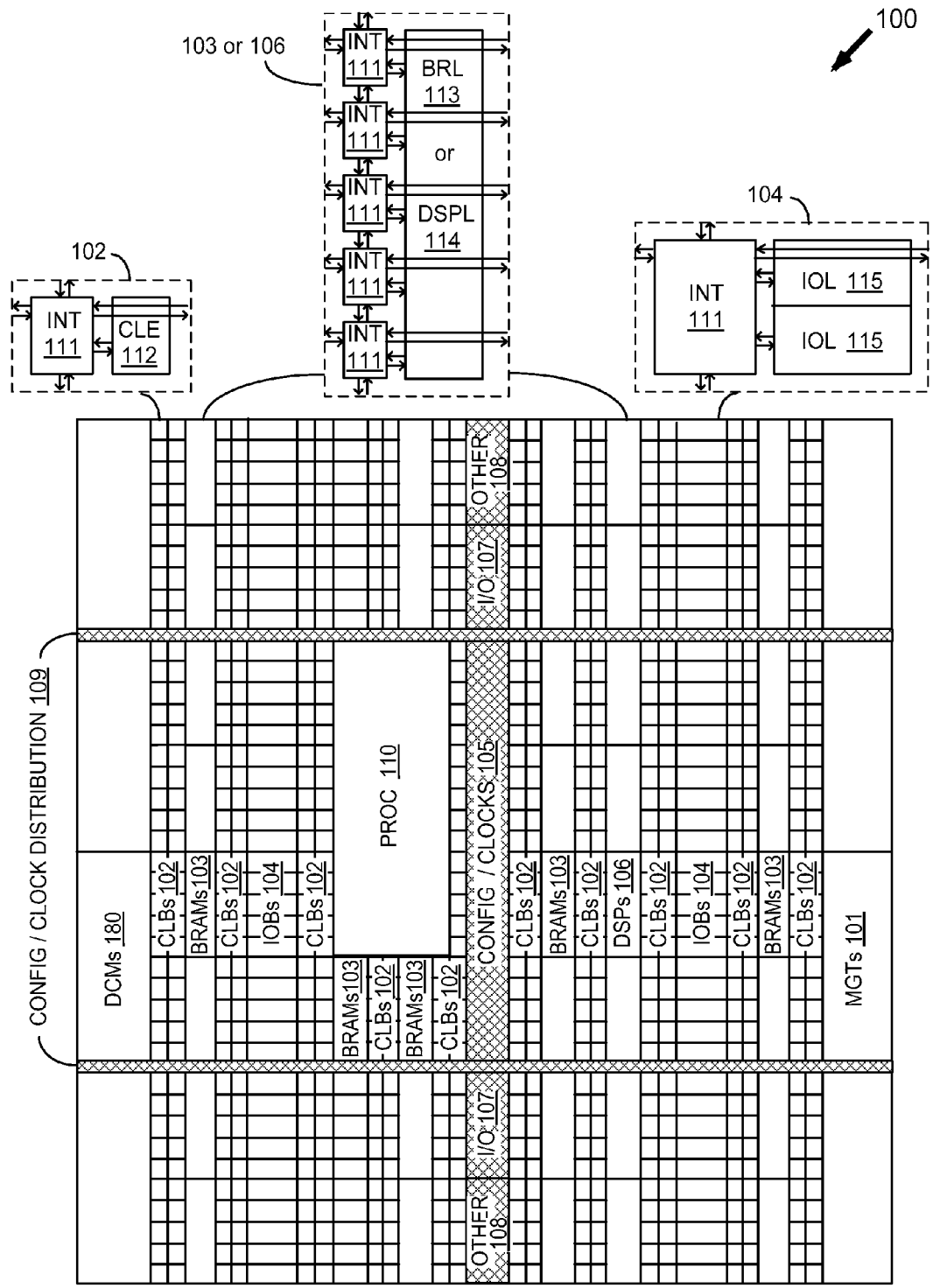
FIG. 1 illustrates an exemplary FPGA architecture.

Embodiments of the invention can be used with various types of target PLDs, such as field programmable gate arrays (FPGAs). FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. A given set of programmable tiles of an FPGA is referred to herein as a programmable fabric of the FPGA.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 also includes one or more dedicated processor blocks (PROC 110). The processor block 110 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art. The processor block 110 is coupled to the programmable logic of the FPGA in a well known manner.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the FPGA die. Configuration information for the programmable logic is stored in configuration memory. The configuration logic 105 provides an interface to, and loads configuration data to, the configuration memory. A stream of configuration data ("configuration bitstream") may be coupled to the configuration logic 105, which in turn loads the configuration memory. Notably, the configuration logic 105 is configured to support the loading of partial configuration bitstreams while the FPGA is active. This allows for reconfiguration of portions of the FPGA during runtime. The configuration and reconfiguration process for the FPGA is well known in the art.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations as well as the location of the blocks within the array included at the top of FIG. 1 are purely exemplary. For example, in an actual FPGA more than one adjacent column of CLBs is typically included wherever the CLBs appear, to facilitate the efficient implementation of user logic. An exemplary FPGA that includes an architecture similar to that of FIG. 1 is the VIRTEX-5 FPGA commercially available from Xilinx, Inc. of San Jose, Calif.

Figure 2:
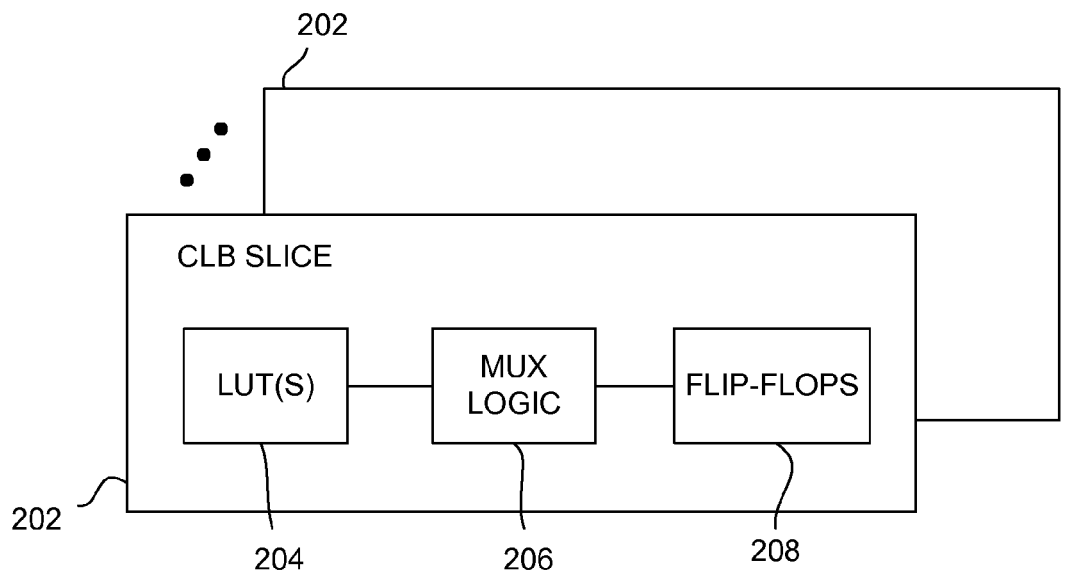
FIG. 2 is a high-level block diagram depicting an exemplary embodiment of a configurable logic element in a configurable logic block in accordance with one or more aspects of the invention.

FIG. 2 is a high-level block diagram depicting an exemplary embodiment of the CLE 112 of a CLB 102 in accordance with one or more aspects of the invention. The CLE 112 includes one or more logic slices 202. Each of the slices 202 may include a plurality of lookup tables (LUTs) 204, multiplexer logic 206, and a plurality of flip-flops 208. Inputs of the LUTs 204 are configured to receive input signals to the CLE 112 (e.g., signals from the interconnect element 111). Outputs of the LUTs 204 are coupled to inputs of the multiplexer logic 206. Outputs of the multiplexer logic 206 are coupled to inputs of the flip-flops 208. Outputs of the flip-flops 208 are configured to provide output signals of the CLE 112 (e.g., signals coupled to the interconnect element 111). Each of the LUTs 204 may be configured to perform various types of logic functions of its inputs to produce its outputs. The outputs of the LUTs 204 may be selectively coupled to the flip-flops 208 via the multiplexer logic 206. One specific non-limiting example of a slice is described below with respect to FIG. 3.

Figure 3:
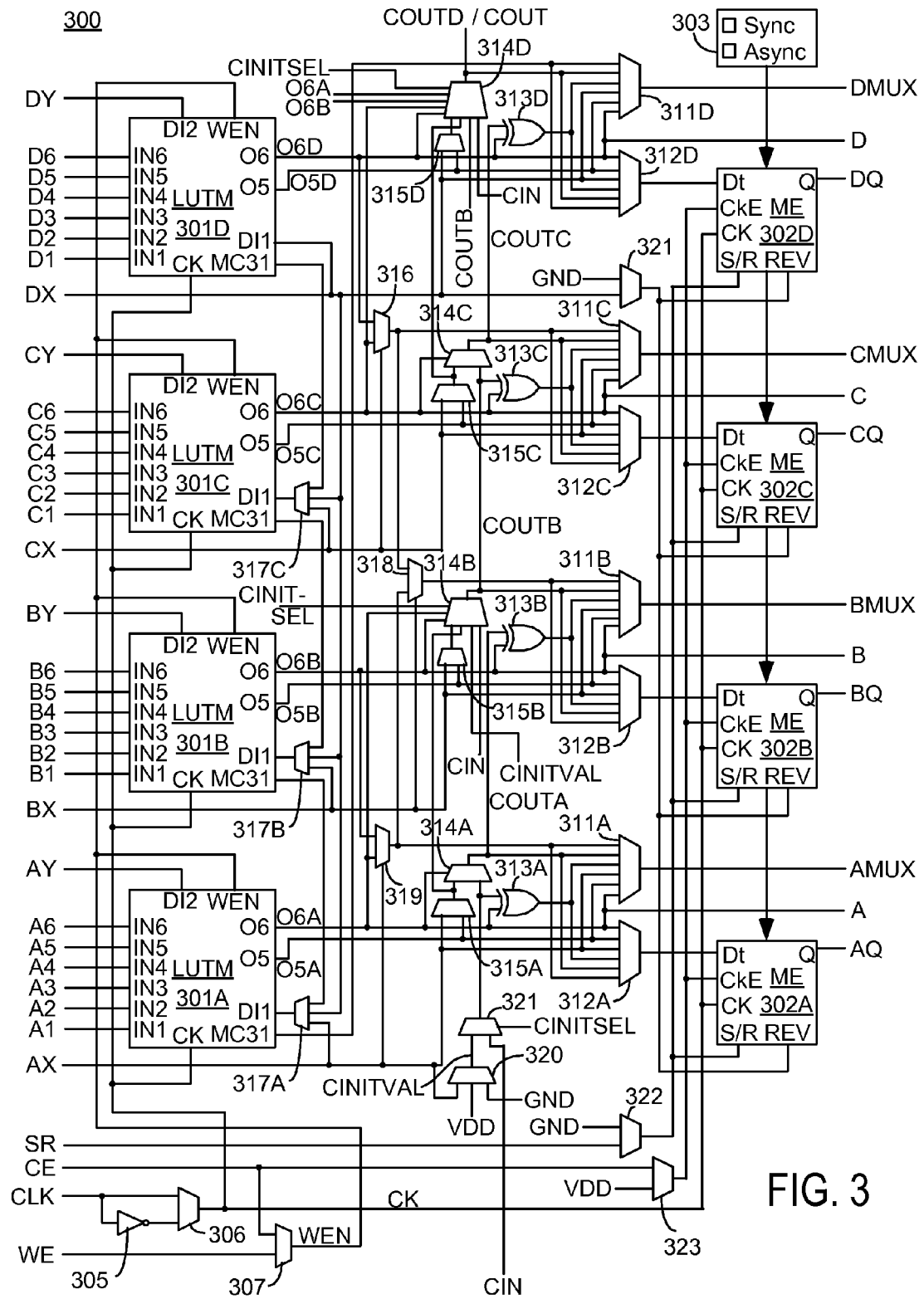
FIG. 3 is a block diagram of an exemplary configurable logic block slice.

FIG. 3 is a block diagram of a slice 300 that can be used, for example, in a CLB 102 of the FPGA 100 in FIG. 1. The slice 300 includes four lookup tables (LUTs) 301A-301D. Each of the LUTs 301A-301D can function in any of several modes. When in lookup table mode, each LUT has six data input signals IN1-IN6 that are supplied by the FPGA interconnect structure (e.g., INT 111). One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 317A-317C for LUTs 301A-301C), or to the two 32-bit RAMs via input terminals DI1 and DI2. RAM write operations in the LUT RAMs are controlled by clock signal CK from multiplexer 306 and by write enable signal WEN from multiplexer 307, which can selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals can be provided through the LUT output terminals, and the 32-bit shift out signal can also be provided more directly via LUT output terminal MC31. The 32-bit shift out signal MC31 of LUT 301A can also be provided to the general interconnect structure for shift register chaining, via output select multiplexer 311D and CLE output terminal DMUX.

The LUTs 301A-301D are each driven by six LUT data input terminals A1-A6, B1-B6, C1-C6, and D1-D6 and each provide two LUT output signals O5 and O6 (In the present specification, the same reference characters are used to refer to terminals, signal lines, and their corresponding signals.) The O6 output terminals from LUTs 301A-301D drive slice output terminals A-D, respectively. The slice 300 also includes: output select multiplexers 311A-311D driving output terminals AMUX-DMUX; multiplexers 312A-312D driving the data input terminals of flip-flops 302A-302D; combinational multiplexers 316, 318, and 319; bounce multiplexer circuits 322-323; a circuit represented by inverter 305 and multiplexer 306 (which together provide an optional inversion on the input clock path); and carry logic comprising multiplexers 314A-314D, 315A-315D, 320-321 and exclusive OR gates 313A-313D. All of these elements are coupled together as shown in FIG. 3. Where select inputs are not shown for the multiplexers illustrated in FIG. 3, the select inputs are controlled by configuration memory cells. These configuration memory cells, which are well known, are omitted from FIG. 3 for clarity, as from other selected figures herein.

Each flip-flop 302A-302D can be programmed to function as a synchronous or asynchronous flip-flop or latch. The selection between synchronous and asynchronous functionality is made for all four flip-flops in the slice 300 by programming Sync/Asynch selection circuit 303. When a flip-flop is programmed so that the S/R (set/reset) input signal provides a set function, the REV input terminal provides the reset function. When the flip-flop is programmed so that the S/R input signal provides a reset function, the REV input terminal provides the set function. Flip-flops 302A-302D are clocked by a clock signal CK, e.g., provided by a global clock network or by the interconnect structure. Such programmable flip-flops are well known in the art of FPGA design. Each flip-flop 302A-302D provides a registered output signal AQ-DQ to the interconnect structure.

While the slice 300 has been shown as an example, those skilled in the art will appreciate that a CLB or a CLB slice may include different logic configurations as are known in the art. For purposes of the present invention, a CLB or a slice generally includes LUT logic, multiplexer logic, and flip-flop logic, as shown in FIG. 2. The slice 300 is merely one of a myriad of possible configurations and is shown as a non-limiting example only.

Figure 4:
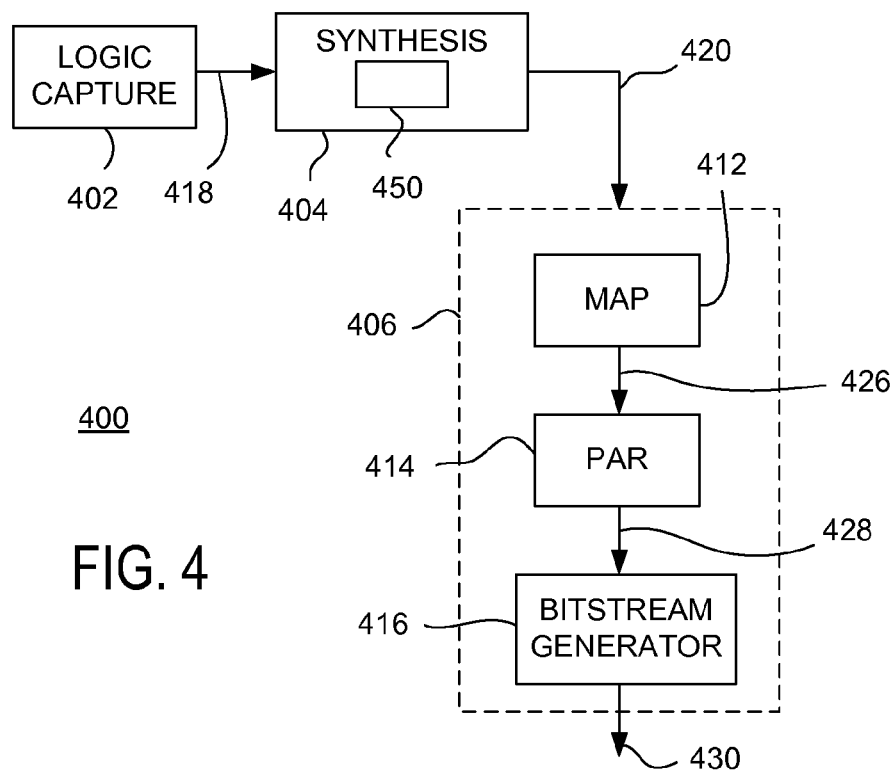
FIG. 4 is a block diagram depicting exemplary embodiments of a logic design system for a programmable logic device (PLD) in accordance with one or more aspects of the invention.

FIG. 4 is a block diagram depicting exemplary embodiments of a logic design system 400 for an integrated circuit in accordance with one or more aspects of the invention. In some embodiments, the system 400 includes a logic capture tool 402, a synthesis tool 404, and an implementation tool 406. In the embodiment shown, the system 400 is configured to implement a logic design using a target PLD, such as an FPGA. Accordingly, the implementation tool 406 includes a map tool 412, a place-and-route (PAR) tool 414, and a bitstream generator tool 416.

The term "tool" is meant to encompass hardware, software, and hardware/software embodiments. For example, the tools in the system 400 may be implemented using hardware, such as using one or more integrated circuits (e.g., an FPGA implementation) that is/are configured to perform the functions of the tools, as described herein. The tools in the system 400 may be part of one or more software programs stored in a memory and configured for execution by a processor (e.g., software executed by a computer). That is, the tools may be software modules. In yet another embodiment, the tools in the system 400 may be implemented using hardware (e.g., integrated circuit(s)) that is configured to perform the functions of the tools by execution of software. That is, the tools are hardware modules that execute software to perform their respective functions.

The logic capture tool 402 is configured to capture a circuit design from a user and generate a behavioral description 418 of the circuit design. The behavioral description 418 includes a plurality of circuit components, such as flip-flops, multiplexers, combinatorial logic, memories, and the like, connected together via signal conductors (nets). The synthesis tool 404 is configured to receive the behavioral description 418. The synthesis tool 404 processes the behavioral description 418 to produce a logical description 420 of the circuit design. The logical description 420 includes a logical network list ("netlist") of lower-level circuit elements and logic gates, as well as connections (nets) between inputs and outputs thereof, in terms of the hierarchy specified in the behavioral description 418. The map tool 412 is configured to receive the logical description 420. The map tool 412 maps the logical description 420 onto physical resources within the target FPGA (i.e., the circuit components, logic gates, and signals are mapped onto LUTs, flip-flops, clock buffers, I/O pads, and the like of the target FPGA). The map tool 408 produces a mapped circuit description 426. The mapped circuit description 426 includes groupings of the physical resources of the target FPGA expressed in terms of CLBs and IOBs that include these resources. The PAR tool 414 is configured to receive the mapped circuit description 426. The PAR tool 414 determines placement for the physical resource groupings of the mapped circuit description 426 in the target FPGA and apportions the appropriate routing resources. The PAR tool 414 produces physical design data 428. The bitstream generator tool 416 is configured to receive the physical design data 428 and produce bitstream data 430 for the target FPGA.

In accordance with aspects of the invention, the logic design system 400 further includes a tool 450 for processing flip-flop logic in the circuit design for implementation in the target integrated circuit. In some embodiments, the tool 450 is part of the synthesis tool 404. Those skilled in the art will appreciate that the tool 450 may be part of other tools in a design system or may be a separate tool in such design system.

Figure 5:
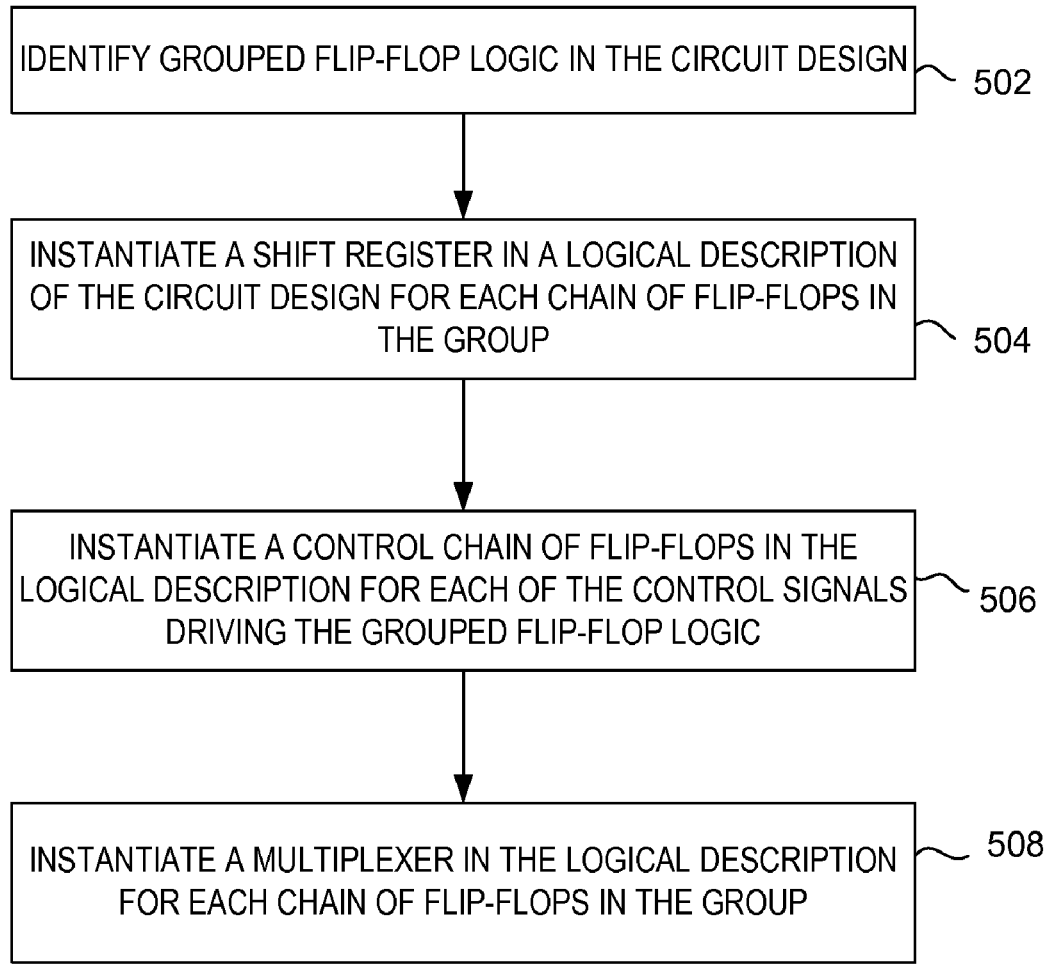
FIG. 5 is a flow diagram depicting an exemplary embodiment of a method for processing flip-flop logic in a circuit design for implementation in an integrated circuit in accordance with one or more aspects of the invention.

FIG. 5 is a flow diagram depicting an exemplary embodiment of a method 500 for processing flip-flop logic in a circuit design for implementation in an integrated circuit in accordance with one or more aspects of the invention. The method 500 may be performed by the tool 450 in the design system 400 of FIG. 4. The method 500 begins at step 502, where grouped flip-flop logic is identified in the circuit design. In general, the grouped flip-flop logic may include one or more chains of flip-flops that are responsive to multiple control signals. Notably, the control signals may include a set signal and a reset signal. As is known in the art, when a flip-flop is set, it stores an asserted logic state. When a flip-flop is reset, it stores a de-asserted logic state. For purposes of clarity by example, the asserted logic state is defined as a logic high or logic '1', and the de-asserted logic state is defined as a logic low or a logic '0'. In some cases, the set and reset signals are single bit signals and are coupled to all set and reset inputs, respectively, of the flip-flops in the group. In other cases, the set and reset signals are multi-bit signals. Examples of grouped flip-flop logic are described below with respect to FIGS. 6 and 7.

Figure 6:
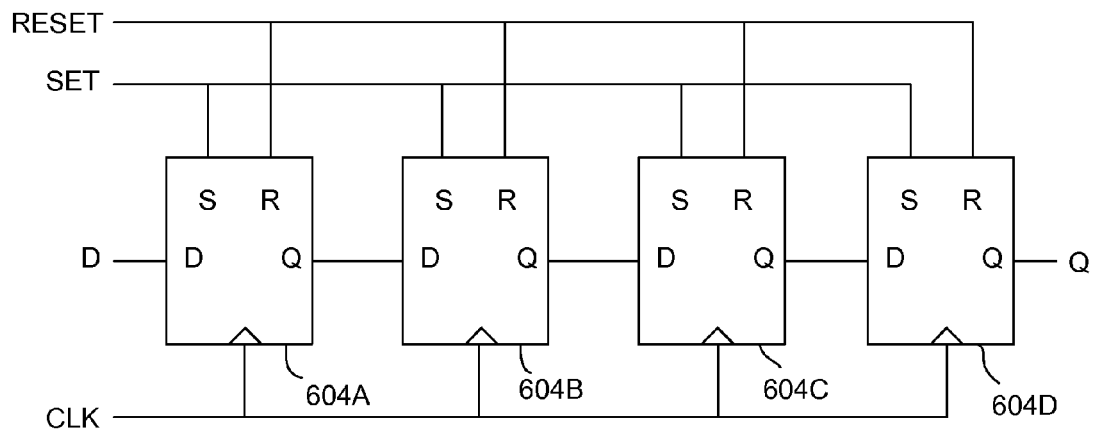
FIG. 6 is a block diagram depicting an exemplary embodiment of grouped flip-flop logic in accordance with one or more aspects of the invention.

FIG. 6 is a block diagram depicting an exemplary embodiment of grouped flip-flop logic 600 in accordance with one or more aspects of the invention. The grouped flip-flop logic 600 includes a chain 602 of flip-flops 604A through 604D (collectively flip-flops 604). For purposes of clarity, the present example of grouped flip-flop logic includes a single chain of four flip-flops. Those skilled in the art will appreciate that the chain 602 may generally include a plurality of flip-flops. An Example of grouped flip-flop logic with more than one chain is described below.

The chain 602 includes a input receiving a signal D and an output providing a signal Q. Each of the flip-flops 604 includes a data input, data output, clock input, a set input, and a reset input. The clock input of each of the flip-flops 604 is driven by a clock signal CLK. The set input of each of the flip-flops 604 is driven by a set signal SET. The reset input of each of the flip-flops 604 is driven by a reset signal RESET. The data input of the flip-flop 604A is configured to receive the signal D. The data output of the flip-flop 604A is coupled to the data input of the flip-flop 604B, the data output of the flip-flop 604B is coupled to the data input of the flip-flop 604C, the data output of the flip-flop 604C is coupled to the data input of the flip-flop 604D, and the output of the flip-flop 604D provides the signal Q.

Figure 7:
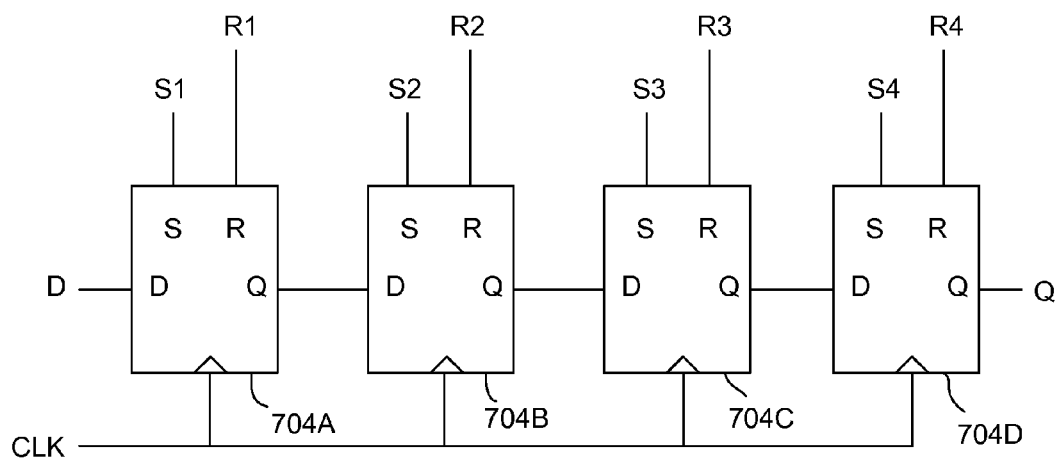
FIG. 7 is a block diagram depicting another exemplary embodiment grouped flip-flop logic in accordance with one or more aspects of the invention.

FIG. 7 is a block diagram depicting another exemplary embodiment grouped flip-flop logic 700 in accordance with one or more aspects of the invention. The grouped flip-flop logic 700 includes a chain 702 of flip-flops 704A through 704D (collectively flip-flops 704). For purposes of clarity, the present example of grouped flip-flop logic includes a single chain of four flip-flops. Those skilled in the art will appreciate that the chain 602 may generally include a plurality of flip-flops. An Example of grouped flip-flop logic with more than one chain is described below.

The chain 702 includes a data input D and a data output Q. Each of the flip-flops 704 includes a data input, a data output, a clock input, a set input, and a reset input. The clock input of each of the flip-flops 704 is driven by a clock signal CLK. A set signal SET includes a bit for each of the flip-flops 704, e.g., four bits S1-S4. Likewise, a reset signal RESET includes a bit for each of the flip-flops 704, e.g., four bits R1-R4. The bits of the set signal SET respectively drive the set inputs of the flip-flops 704A through 704D. The bits of the reset signal RESET respectively drive the reset inputs of the flip-flops 704A through 704D. The data input of the flip-flop 704A is configured to receive the signal D. The data output of the flip-flop 704A is coupled to the data input of the flip-flop 704B, the data output of the flip-flop 704B is coupled to the data input of the flip-flop 704C, the data output of the flip-flop 704C is coupled to the data input of the flip-flop 704D, and the output of the flip-flop 704D provides the signal Q.

Returning to FIG. 5, the method 500 proceeds from step 502 to step 504. At step 504, a shift register is instantiated in a logical description of the circuit design for each chain of flip-flops in the group. For each chain, the depth of the shift register (i.e., the number of bits stored) is set to match the number of flip-flops in the chain. Thus, the shift register(s) are functionally equivalent to the chain(s) of flip-flops.

At step 506, a control chain of flip-flops is instantiated in the logical description for each of the control signals driving the group. At step 508, a multiplexer is instantiated in the logical description for each chain of flip-flops in the group. For a given chain, the multiplexer is configured to select among the output of the respectively instantiated shift register and additional multiplexer inputs based on outputs of the control chains of flip-flops. In this manner, a controlled shift register primitive is instantiated for the grouped flip-flop logic in the circuit design. The controlled shift register primitive is functionally equivalent to the grouped flip-flop logic. When implemented for an integrated circuit, the controlled shift register primitive may be more efficient in terms of implementation area than the grouped flip-flop logic. The method 500 may be understood with reference to the following examples.

Figure 8:
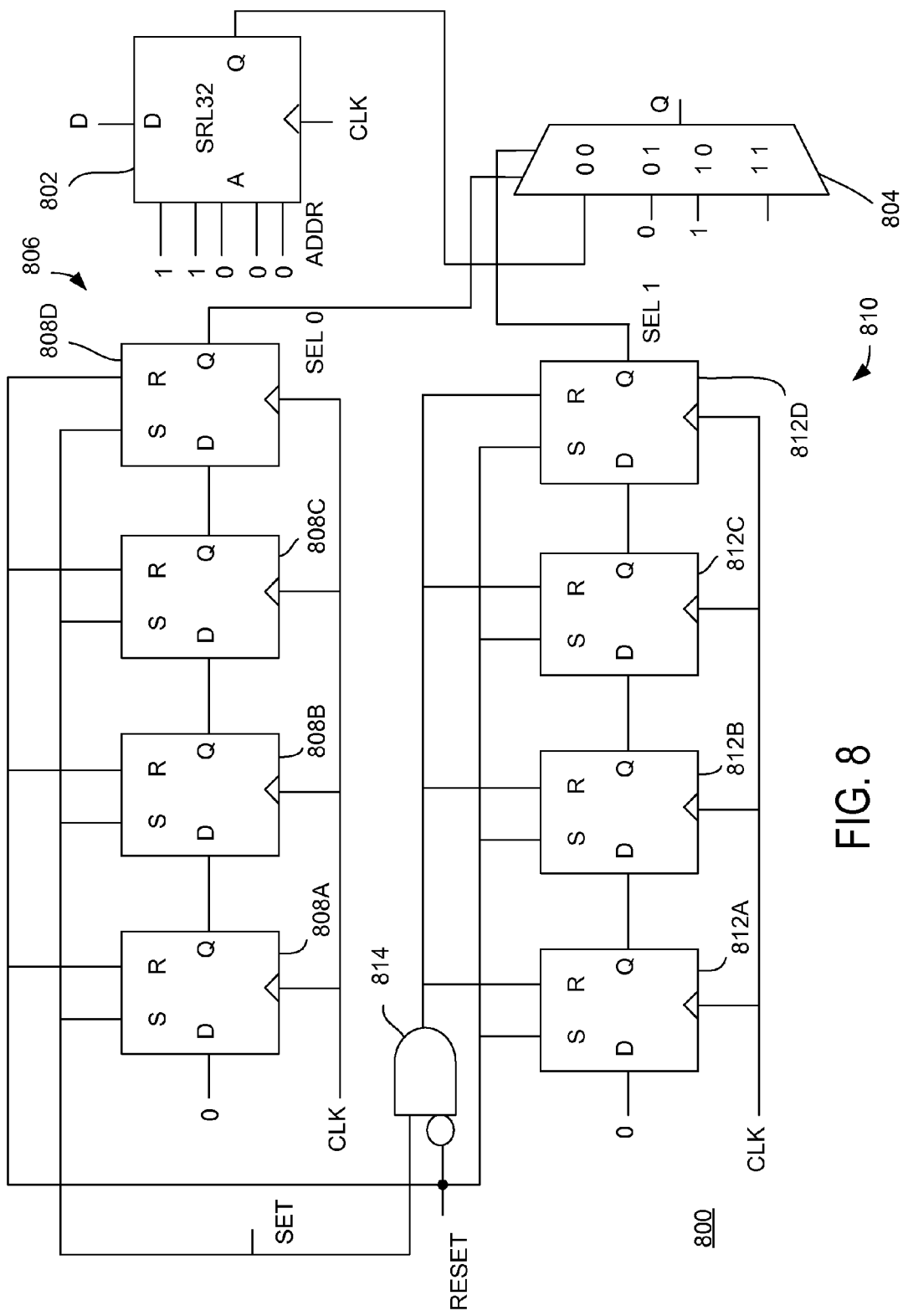
FIG. 8 is a block diagram depicting an exemplary embodiment of a controlled shift register primitive in accordance with one or more aspects of the invention.

FIG. 8 is a block diagram depicting an exemplary embodiment of a controlled shift register primitive 800 in accordance with one or more aspects of the invention. The controlled shift register primitive 800 is functionally equivalent to the grouped flip-flop logic 600 shown in FIG. 6 and may be generated by the method 500 when processing the same. The primitive 800 includes a shift register 802, a multiplexer 804, a control chain 806 of flip-flops 808A through 808D (collectively flip-flops 808), a control chain 810 of flip-flops 812A through 812D (collectively flip-flops 812), and combinatorial logic 814. The primitive 800 includes a data input D, a data output Q, a set input SET, and a reset input RESET, which are respectively mapped to the data input D, the data output Q, the set input SET, and the reset input RESET of the chain 602.

The shift register 802 includes a data input, a data output, an address input, and a clock input. The data input, the address input, and the clock input of the shift register 802 are driven by the signal D, a signal ADDR, and the signal CLK, respectively. In the present example, the shift register 802 is configured to store 32 bits (i.e., a depth of 32 bits). The address input selects which of these 32 bits is provided on the data output, labeled SRLout. In the present example, the chain 602 includes four flip-flops, so the depth of the shift register 802 is selected to be four (i.e., the fourth bit is selected as output). Thus, the address signal ADDR is configured as '00011'. The output SRLout of the shift register 802 is coupled to an input of the multiplexer 804. Those skilled in the art will appreciate that the shift register 802 may have other depths.

The control chain 806 includes an input configured to receive a de-asserted logic state (e.g., logic '0'). An output of the control chain 806 is coupled to an input of the multiplexer 804. Each of the flip-flops 808 includes a data input, a data output, set input, a reset input, and a clock input. The clock input of each of the flip-flops 808 is driven by a clock signal CLK. The set input of each of the flip-flops 808 is driven by the set signal SET. The reset input of each of the flip-flops 808 is driven by the reset signal RESET. The data input of the flip-flop 808A is configured to receive the de-asserted signal '0'. The data output of the flip-flop 808A is coupled to the data input of the flip-flop 808B, the data output of the flip-flop 808B is coupled to the data input of the flip-flop 808C, the data output of the flip-flop 808C is coupled to the data input of the flip-flop 808D, and the output of the flip-flop 808D provides a signal SEL0.

Inputs of the combinatorial logic 814 are configured to receive the signals SET and RESET, respectively. In the present example, the combinatorial logic 814 comprises an AND gate, where the input receiving the signal RESET is inverted. Those skilled in the art will appreciate that the combinatorial logic 814 may include various types of logic gates configured to be functionally equivalent to that shown in FIG. 8. Notably, the combinatorial logic 814 is configured such that the signal RESET has priority over the signal SET (i.e., the output of the AND gate is the same if the signal RESET is asserted or if both the signal RESET and the signal SET are asserted). Those skilled in the art will appreciate that the logic 814 can be configured differently to implement a different priority (i.e., SET over RESET).

The control chain 810 includes an input configured to receive a de-asserted logic state (e.g., logic '0'). An output of the control chain 810 is coupled to an input of the multiplexer 804. Each of the flip-flops 812 includes a data input, a data output, set input, a reset input, and a clock input. The clock input of each of the flip-flops 812 is driven by a clock signal CLK. The set input of each of the flip-flops 812 is driven by the signal RESET. The reset input of each of the flip-flops 812 is driven by the output of the combinatorial logic 814. The data input of the flip-flop 812A is configured to receive the de-asserted signal '0'. The data output of the flip-flop 812A is coupled to the data input of the flip-flop 812B, the data output of the flip-flop 812B is coupled to the data input of the flip-flop 812C, the data output of the flip-flop 812C is coupled to the data input of the flip-flop 812D, and the output of the flip-flop 812D provides a signal SEL1.

The multiplexer 804 includes four data inputs, a control input, and an output. The output of the multiplexer 804 provides the signal Q. One of the inputs of the multiplexer 804 is coupled to the output of the shift register 802. Another of the inputs of the multiplexer 804 is configured to receive an asserted logic state (e.g., a logic '1'). Another of the inputs of the multiplexer 804 is configured to receive a de-asserted logic state (e.g., a logic '0'). The last input of the multiplexer 804 may be a "do not care" value (i.e., logic '1' or logic '0'). The control input is coupled to the outputs of the control chains 806 and 810. The control input comprises a 2-bit input, where the signal SEL0 comprises the most significant bit (MSB) and the signal SEL1 comprises the least significant bit (LSB). In case the control input receives '00', the multiplexer 804 selects the output SRLout. In case the control input receives '01', the multiplexer 804 selects a signal having the de-asserted state (logic '0'). In case the control input receives '10', the multiplexer 804 selects a signal having the asserted state (logic '1'). In case the control input receives '11', the multiplexer 804 selects the "do not care" value input. However, as described below, the primitive 800 is configured such that both the signals SEL0 and SEL1 are never concurrently asserted.

In operation, when neither the signal SET nor the signal RESET is asserted, the signals SEL0 an SEL1 provide a control value '00' to the multiplexer 804, thereby selecting the output of the shift register 802. Thus, the data values input to the shift register 802 are output from the multiplexer 804 for each clock cycle.

Consider the case where the signal SET is asserted and the signal RESET is de-asserted. The flip-flops 808 in the control chain 806 are set. Thus, the signal SEL0 will include a sequence of four asserted values for the next four clock cycles. The output of the combinatorial logic 814 is asserted, thereby resetting the flip-flops 812 in the control chain 810. Thus, the signal SEL1 will include a sequence of four de-asserted values for the next four clock cycles. Accordingly, the control input to the multiplexer 804 will be '10' for the next four clock cycles, thereby selecting a signal with an asserted value (logic '1') for the next four clock cycles. This has the same effect as setting all of the bits in the shift register 802 or all of the flip-flops in the chain 602.

Conversely, consider the case where the signal SET is de-asserted and the signal RESET is asserted. The flip-flops 812 in the control chain 810 are set. Thus, the signal SEL1 will include a sequence of four asserted values for the next four clock cycles. The output of the combinatorial logic 814 is de-asserted. The flip-flops 808 in the control chain 806 are reset. Thus, the signal SEL0 will include a sequence of four de-asserted values for the next four clock cycles. Accordingly, the control input to the multiplexer 804 will be '01' for the next four clock cycles, thereby selecting a signal with an de-asserted value (logic '0') for the next four clock cycles. This has the same effect as resetting all of the bits in the shift register 802 or all of the flip-flops in the chain 602.

In the present example, it is assumed that reset has priority over set. Thus, if both the signal SET and the signal RESET are asserted concurrently, the flip-flops 812 in the control chain 810 are set. Thus, the signal SEL1 will include a sequence of four asserted values for the next four clock cycles. The output of the combinatorial logic 814 is de-asserted. The flip-flops 808 in the control chain 806 are reset (since reset has priority over set). Thus, the signal SEL0 will include a sequence of four de-asserted values for the next four clock cycles. Accordingly, the control input to the multiplexer 804 will be '01' for the next four clock cycles, thereby selecting a signal with an de-asserted value (logic '0') for the next four clock cycles. This has the same effect as resetting all of the bits in the shift register 802 or all of the flip-flops in the chain 602. Those skilled in the art will appreciate that the primitive 800 can be configured such that set has priority over reset.

Figure 9:
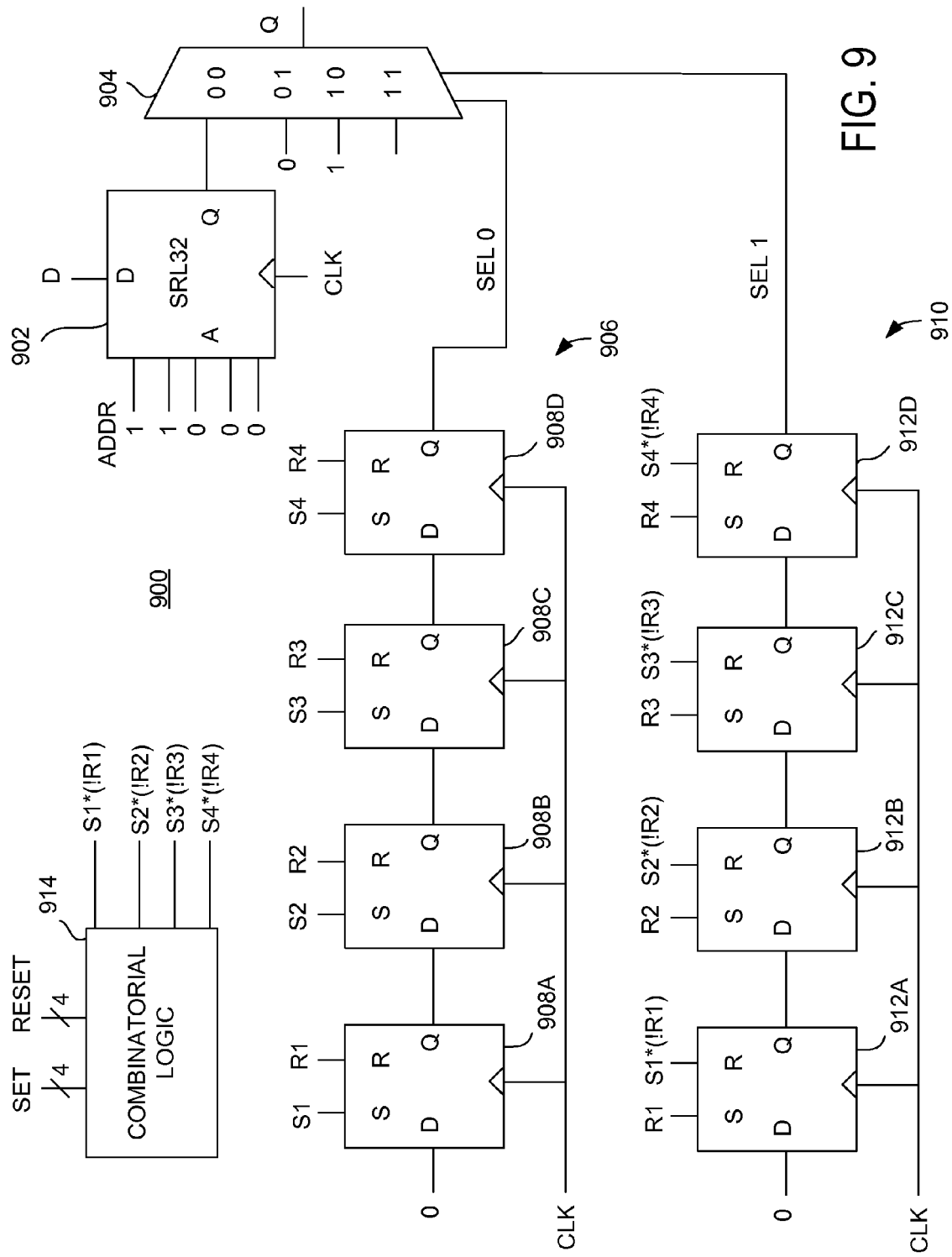
FIG. 9 is a block diagram depicting another exemplary embodiment of a controlled shift register primitive in accordance with one or more aspects of the invention.

FIG. 9 is a block diagram depicting another exemplary embodiment of a controlled shift register primitive 900 in accordance with one or more aspects of the invention. The controlled shift register primitive 900 is functionally equivalent to the grouped flip-flop logic 700 shown in FIG. 7 and may be generated by the method 500 when processing the same. The primitive 900 includes a shift register 902, a multiplexer 904, a control chain 906 of flip-flops 908A through 908D (collectively flip-flops 908), a control chain 910 of flip-flops 912A through 912D (collectively flip-flops 912), and combinatorial logic 914. The primitive 900 includes a data input D, a data output Q, a set input SET, and a reset input RESET, which are respectively mapped to the data input D, the data output Q, the set input SET, and the reset input RESET of the chain 702.

The shift register 902 includes a data input, a data output, an address input, and a clock input. The data input, the address input, and the clock input of the shift register 902 are driven by the signal D, a signal ADDR, and the signal CLK, respectively. In the present example, the shift register 902 is configured to store 32 bits (i.e., a depth of 32 bits). The address input selects which of these 32 bits is provided on the data output, labeled SRLout. In the present example, the chain 702 includes four flip-flops, so the depth of the shift register 902 is selected to be four (i.e., the fourth bit is selected as output). Thus, the address signal ADDR is configured as '00011'. The output SRLout of the shift register 902 is coupled to an input of the multiplexer 904.

The control chain 906 includes an input configured to receive a de-asserted logic state (e.g., logic '0'). An output of the control chain 906 is coupled to an input of the multiplexer 904. Each of the flip-flops 908 includes a data input, a data output, set input, a reset input, and a clock input. The clock input of each of the flip-flops 908 is driven by a clock signal CLK. The set inputs of the flip-flops 908A-908D are driven by the bits S1-S4 of the signal SET, respectively. The reset inputs of the flip-flops 908A-908D is driven by the bits R1-R4 of the signal RESET. The data input of the flip-flop 908A is configured to receive the de-asserted signal '0'. The data output of the flip-flop 908A is coupled to the data input of the flip-flop 908B, the data output of the flip-flop 908B is coupled to the data input of the flip-flop 908C, the data output of the flip-flop 908C is coupled to the data input of the flip-flop 908D, and the output of the flip-flop 908D provides a signal SEL0.

Inputs of the combinatorial logic 914 are configured to receive the signals SET and RESET, respectively. The combinatorial logic 914 is configured to produce logical AND results of the bits S1-S4 of the signal SET with inversions of the bits R1-R4 of the signal RESET (e.g., S1 AND !R1, S2 AND !R2, etc.). Those skilled in the art will appreciate that the combinatorial logic 914 may include various types of logic gates configured to produce the logical AND results described above. Notably, the combinatorial logic 914 is configured such that the signal RESET has priority over the signal SET. Those skilled in the art will appreciate that the logic 914 can be configured differently to implement a different priority (i.e., SET over RESET).

The control chain 910 includes an input configured to receive a de-asserted logic state (e.g., logic '0'). An output of the control chain 910 is coupled to an input of the multiplexer 904. Each of the flip-flops 912 includes a data input, a data output, set input, a reset input, and a clock input. The clock input of each of the flip-flops 912 is driven by a clock signal CLK. The set inputs of the flip-flops 912A-912D are driven by the logical AND results produced by the combinatorial logic 914, respectively. The reset inputs of the flip-flops 912 are driven by the bits R1-R4 of the signal RESET. The data input of the flip-flop 912A is configured to receive the de-asserted signal '0'. The data output of the flip-flop 912A is coupled to the data input of the flip-flop 912B, the data output of the flip-flop 912B is coupled to the data input of the flip-flop 912C, the data output of the flip-flop 912C is coupled to the data input of the flip-flop 912D, and the output of the flip-flop 912D provides a signal SEL1.

The multiplexer 904 includes four data inputs, a control input, and an output. The output of the multiplexer 904 provides the signal Q. One of the inputs of the multiplexer 904 is coupled to the output of the shift register 902. Another of the inputs of the multiplexer 904 is configured to receive an asserted logic state (e.g., a logic '1'). Another of the inputs of the multiplexer 904 is configured to receive a de-asserted logic state (e.g., a logic '0'). The last input of the multiplexer 904 may be connected to a "do not care" value. The control input is coupled to the outputs of the control chains 906 and 910. The control input comprises a 2-bit input, where the signal SEL0 comprises the most significant bit (MSB) and the signal SEL1 comprises the least significant bit (LSB). In case the control input receives '00', the multiplexer 904 selects the output SRLout. In case the control input receives '01', the multiplexer 904 selects a signal having the de-asserted state (logic '0'). In case the control input receives '10', the multiplexer 904 selects a signal having the asserted state (logic '1'). In case the control input receives '11', the multiplexer 904 selects the "do not care" input. However, as described below, the primitive 900 is configured such that both the signals SEL0 and SEL1 are never concurrently asserted.

In operation, when neither the signal SET nor the signal RESET is asserted, the signals SEL0 an SEL1 provide a control value '00' to the multiplexer 904, thereby selecting the output of the shift register 902. Thus, the data values input to the shift register 902 are output from the multiplexer 904 for each clock cycle.

The bits of the signal SET can be independently asserted. Consider the case where the bit S2 of the signal SET is asserted and the bit R2 of the signal RESET is de-asserted. The flip-flops 908B in the control chain 906 is set. Thus, the signal SEL0 will include the sequence 'X1XX' over the next four clock cycles. The value 'X' denotes either logic '1' or logic '0'. The output of the combinatorial logic 914 for S2 AND !R2 is asserted, thereby resetting the flip-flop 912B in the control chain 910. Thus, the signal SEL1 will include the sequence 'X0XX' over the next four clock cycles. Accordingly, the control input to the multiplexer 904 will be '10' on the third clock cycle, thereby selecting a signal with an asserted value (logic '1') for the third clock cycle. This has the same effect as setting the third bit in the shift register 902 (third from the output) or the flip-flop 704B in the chain 702. Those skilled in the art will appreciate that the primitive 900 operates the same when other bits S1-S4 of the signal SET are asserted, while the corresponding bits R1-R4 of the signal RESET are de-asserted. Note that multiple bits S1-S4 of the signal SET may be asserted concurrently.

Conversely, consider the case where the bit S2 of the signal SET is de-asserted and the bit R2 of the signal RESET is asserted. The flip-flop 912B in the control chain 910 is set. Thus, the signal SEL1 will include the sequence 'X1XX' over the next four clock cycles. The output of the combinatorial logic 914 for S2 AND !R2 is de-asserted. The flip-flop 908B in the control chain 906 is reset. Thus, the signal SEL0 will include the sequence 'X0XX' for the next four clock cycles. Accordingly, the control input to the multiplexer 904 will be '01' for the next four clock cycles, thereby selecting a signal with a de-asserted value (logic '0') for the third clock cycle. This has the same effect as resetting the third bit in the shift register 902 (third from the output) or the flip-flop 704B in the chain 702. Those skilled in the art will appreciate that the primitive 900 operates the same when other bits R1-R4 of the signal RESET are asserted, while the corresponding bits S1-S4 of the signal SET are de-asserted. Note that multiple bits R1-R4 of the signal RESET may be asserted concurrently. Note also, that different bits of the signal SET and the signal RESET may be asserted concurrently, and the primitive 900 will operate as described above.

In the present example, it is assumed that reset has priority over set. Thus, if both the bit S2 of the signal SET and the bit R2 of the signal RESET are asserted concurrently, the flip-flop 912B in the control chain 910 is set. Thus, the signal SEL1 will include the sequence 'X1XX' for the next four clock cycles. The output of the combinatorial logic 914 for S2 AND !R2 is de-asserted. The flip-flop 908B in the control chain 906 is reset (since reset has priority over set). Thus, the signal SEL0 will include the sequence 'X0XX' for the next four clock cycles. Accordingly, the control input to the multiplexer 904 will be '01' for the third clock cycle, thereby selecting a signal with a de-asserted value (logic '0') for the third clock cycle. This has the same effect as resetting the third bit in the shift register 902 (from the output) or the flip-flop 704B in the chain 702. Those skilled in the art will appreciate that the primitive 900 can be configured such that set has priority over reset.

Returning to FIG. 4, a controlled shift register primitive generated as described above can be mapped onto CLB logic of a PLD by the map tool 412. For example, a shift register can be mapped onto one or more LUTs each configured as a shift register (e.g., a LUT 301A in FIG. 3). The control chains of flip-flops can be mapped onto flip-flops in one or more CLB slices (e.g., flip-flops 302 in FIG. 3). The multiplexer can be mapped onto multiplexing logic in one or more CLB slices. The combinatorial logic can be implemented using LUT(s) in CLB slice(s).

Figure 10:
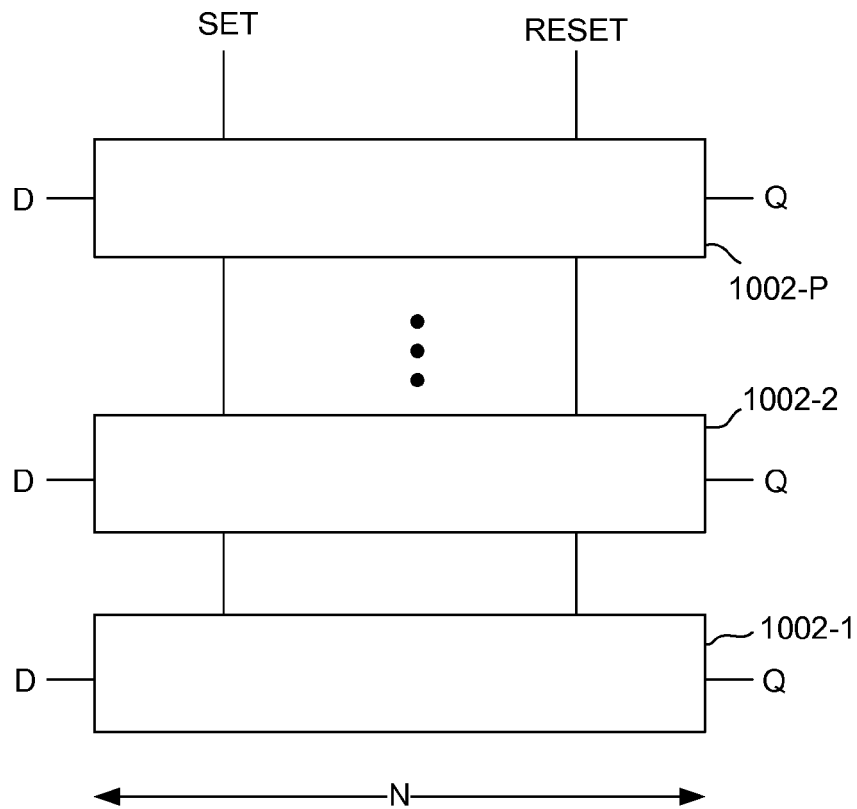
FIG. 10 is a block diagram depicting another exemplary embodiment of grouped flip-flop logic in accordance with one or more aspects of the invention.

To illustrate the gain in implementation area obtained by employing the controlled shift register primitive over grouped flip-flop logic, consider the following example. FIG. 10 is a block diagram depicting another exemplary embodiment of grouped flip-flop logic 1000 in accordance with one or more aspects of the invention. The grouped flip-flop logic 1000 includes flip-flop chains 1002-1 through 1002-P (collectively chains 1002). Each of the chains 1002 includes N flip-flops connected in a serial chain. For clarity, the individual flip-flops are omitted. In the present example, the flip-flops in each of the chains 1002 are responsive to a common signal SET and a common signal RESET. In other embodiments, the signal SET and the signal RESET may be multi-bit signals, in which case the first flip-flop in each of the chains 1002 receives the first bits of the signals SET and RESET, the second flip-flop in each of the chains 1000 receives the second bits of the signal SET and RESET, and so on.

Figure 11:
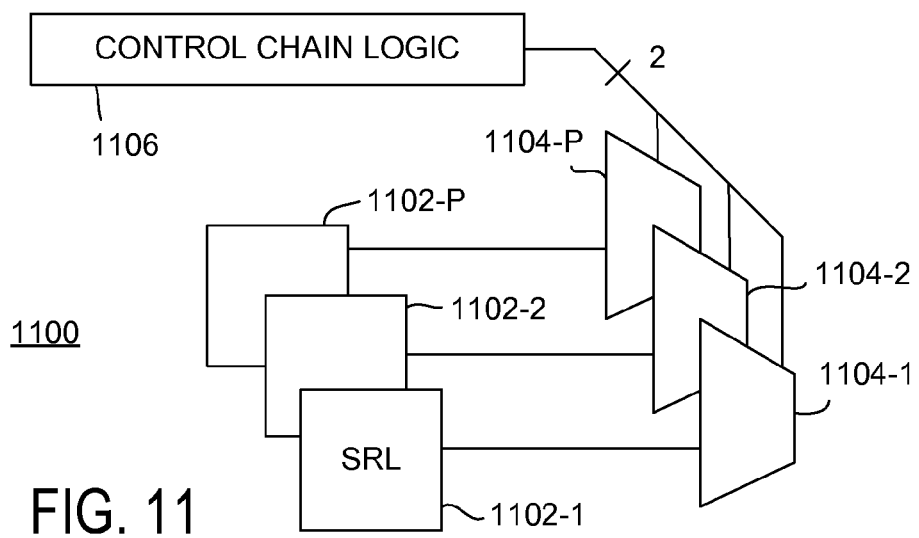
FIG. 11 is a block diagram depicting an exemplary embodiment a controlled shift register primitive in accordance with one or more aspects of the invention.

FIG. 11 is a block diagram depicting an exemplary embodiment a controlled shift register primitive 1100 in accordance with one or more aspects of the invention. The controlled shift register primitive 1100 is functionally equivalent to the grouped flip-flop logic 1000 shown in FIG. 10 and may be generated by the method 500 when processing the same. The primitive 1100 includes shift registers 1102-1 through 1102-P (collectively shift registers 1102), multiplexers 1104-1 through 1104-P (collectively multiplexers 1104), and control chain logic 1106. The control chain logic 1106 may include the control chains 806 and 810 shown in FIG. 8 in cases where single-bit set/reset signals are common among all flip-flops. The control chain logic 1106 may include the control chains 906 and 910 shown in FIG. 9 in cases where multi-bit set/reset signals are common among the flip-flops. Each of the multiplexers 1104 is configured as described above in the single-chain examples of FIGS. 8 and 9. The control chain logic 1106 is common for all of the multiplexers 1104. In essence, the shift register and multiplexer logic from FIG. 8 or FIG. 9 is duplicated, but the control chain logic only needs to be instantiated once.

Referring to FIGS. 10 and 11, for purposes of exposition, assume that each flip-flop in the group 1000 would occupy of a CLB slice. For example, the exemplary slice shown in FIG. 3 includes four flip-flops, so use of one would result in an area cost of ¼ of the slice. Accordingly, the area cost for implementing the group 1000 is NP/4 slices. Now assume that the grouped flip-flop logic 1000 is processed by the method 500 and mapped to the controlled shift register primitive 1100. In that case, the area cost for implementing the control chain logic 1106 is 2N flip-flops (i.e., the control chain logic 1106 includes 2 chains of N flip-flops each). Thus, implementation of the control chain logic 1106 results in an area cost of 2N/4 or N/2 slices. Each shift-register 1102/multiplexer 1104 occupies ¼ of a CLB slice. For example, the exemplary slice shown in FIG. 3 includes four LUTs capable of shift register operation, so use of one with corresponding multiplexer logic would result in an area cost of ¼ of the slice. So the area cost of implementing the shift registers 1102 and the multiplexers 1104 would be P/4 CLB slices.

Accordingly, the total area cost in terms of CLB slices for the controlled shift register primitive 1100 would be N/2+P/4 CLB slices. Therefore, those skilled in the art will appreciate that for increasing P and N, the more area is saved when implementing the controlled shift register primitive 1100 vis-à-vis the grouped flip-flop logic 1000. That is, NP/4 increases faster than N/2+P/4 as N and/or P increase. Those skilled in the art will appreciate that the specific percentages of CLB slice use described above is merely exemplary. CLB slices may include more or less flip-flops and/or LUTs. It is to be understood, however, that regardless of the CLB slice configuration, the controlled shift register primitive described herein may cost less in terms of area than grouped flip-flop logic as the parameters P and/or N increase.

Figure 12:
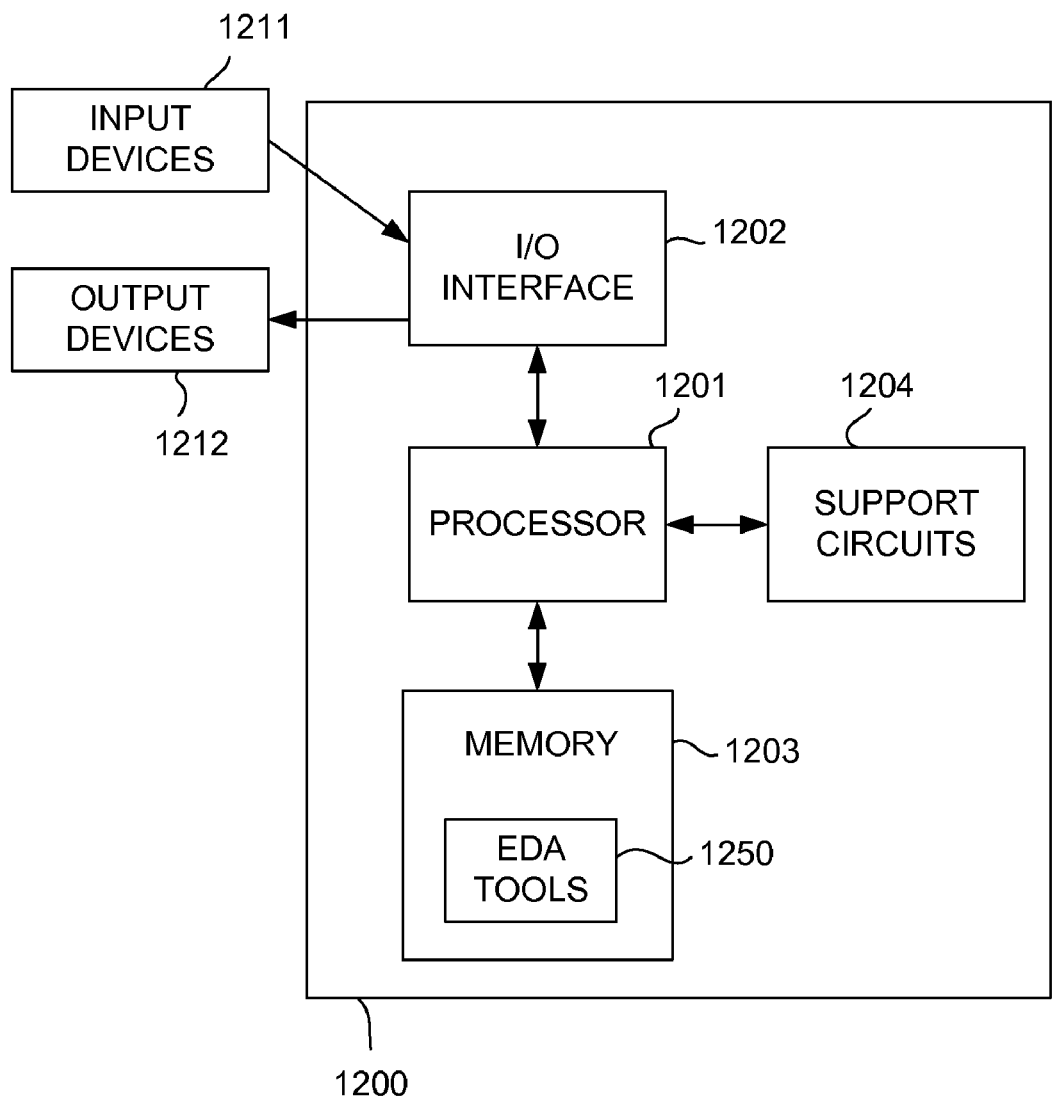
FIG. 12 is a block diagram depicting an exemplary embodiment a computer suitable for implementing the processes described herein in accordance with one or more aspects of the invention.

FIG. 12 is a block diagram depicting an exemplary embodiment a computer 1200 suitable for implementing the processes described herein in accordance with one or more aspects of the invention. The computer 1200 includes a processor 1201, a memory 1203, various support circuits 1204, and an I/O interface 1202. The processor 1201 may include one or more microprocessors known in the art. The support circuits 1204 for the processor 1201 include conventional cache, power supplies, clock circuits, data registers, I/O interfaces, and the like. The I/O interface 1202 may be directly coupled to the memory 1203 or coupled through the processor 1201. The I/O interface 1202 is coupled to various input devices 1211 (e.g., keyboard, mouse, and the like) and output devices 1212 (e.g., display, printer, and the like).

The processor 1201 also cooperates with processor-executable instructions and/or data. These processor-executable instructions/data may comprise hardware, firmware, software, and the like, or some combination thereof. Tools having such processor-executable instructions/data include electronic design automation (EDA) tools 1250 that may implement logic design systems, such as the system 400 shown in FIG. 4. The EDA tools 1250 may include the logic capture tool 402, the synthesis tool 404, and the implementation tool 406 (e.g., the map tool 412, the PAR tool 414, and the bitstream generator tool 416). The memory 1203 may include one or more of the following random access memory, read While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of processing flip-flop logic in a circuit design for implementation in an integrated circuit, comprising:
   identifying a chain of flip-flops in the circuit design, the chain of flip-flops including first and second control signals;
   instantiating, in a logical description of the circuit design, a shift register for the chain of flip-flops;
   instantiating, in the logical description, first and second control chains of flip-flops for the first and second control signals, respectively; and
   instantiating, in the logical description, a multiplexer configured to select among an output of the shift register, an asserted logic state, and a de-asserted logic state based on outputs of the first and second control chains,
   wherein the instantiating a shift register, the instantiating first and second control chains, and the instantiating the multiplexer are performed by a computer,
   wherein the shift register includes a data input, a data output, and an address input, and
   wherein the instantiating the shift register comprises:
      mapping the data input to an input of the chain of flip-flops;
      mapping the data output to an output of the chain of flip-flops; and
      mapping control bits to the address input to select a depth of the shift register that matches a number of the flip-flops in the chain.

2. The method of claim 1, wherein a number of the flip-flops in each of the first and second control chains matches a number of the flip-flops in the identified chain of flip-flops in the circuit design.

3. The method of claim 2, wherein the first control signal comprises a set signal and the second control signal comprises a reset signal, the set signal being coupled to a set input of each of the flip-flops in the chain, the reset signal being coupled to a reset input of each of the flip-flops in the chain, wherein the step of instantiating the first and second control chains comprises:
   instantiating combinatorial logic having a first input, a second input, and an output, the output of the combinatorial logic being coupled to a reset input of each of the flip-flops in the second control chain;
   mapping the set signal to a set input of each of the flip-flops in the first control chain and to the first input of the combinatorial logic; and
   mapping the reset signal to a reset input of each of the flip-flops in the first control chain, to the second input of the combinatorial logic, and to a set input of each of the flip-flops in the second control chain.

4. The method of claim 3, wherein the step of instantiating the first and second control chains comprises:
   coupling the de-asserted logic state to an input of each of the first and second control chains; and
   coupling outputs of the first and second control chains to a two-bit control input of the multiplexer, the output of the first control chain comprises the most significant bit, and the output of the second control chain comprising the least significant bit, of the two-bit control input.

5. The method of claim 2, wherein the first control signal comprises a multi-bit set signal and the second control signal comprises a multi-bit reset signal, the bits of the set signal being respectively coupled to set inputs of the flip-flops in the chain, the bits of the reset signal being selectively coupled to reset inputs of each of the flip-flops in the chain, wherein the step of instantiating the first and second control chains comprises:
   instantiating combinatorial logic configured to compute logical AND results of the bits of the set signal with inversions of the bits of the reset signal, respectively;
   respectively mapping the bits of the set signal to set inputs the flip-flops in the first control chain;
   respectively mapping the bits of the reset signal to reset inputs the flip-flops in the first control chain and to set inputs of the flip-flops in the second control chain; and
   respectively mapping the logical AND results to the reset inputs of the flip-flops in the second control chain.

6. The method of claim 5, wherein the step of instantiating the first and second control chains comprises:
   coupling the de-asserted logic state to an input of each of the first and second control chains; and
   coupling outputs of the first and second control chains to a two-bit control input of the multiplexer, the output of the first control chain comprises the most significant bit, and the output of the second control chain comprising the least significant bit, of the two-bit control input.

7. The method of claim 1, further comprising:
   identifying additional chains of flip-flops in the circuit design, each of the additional chains responsive to the first and the second control signal;
   instantiating, in the logical description, additional shift registers for the additional chains, respectively;
   instantiating, in the logical description, additional multiplexers, each of the additional multiplexers configured to select among a respective one of the additional shift registers, an asserted logic state, and a de-asserted logic state based on outputs of the first and second control chains.

* * * * *